United States Patent
Tanimoto et al.

(10) Patent No.: US 10,020,282 B2
(45) Date of Patent: Jul. 10, 2018

(54) METHOD FOR MANUFACTURING SEMICONDUCTOR DEVICE, HEAT INSULATING LOAD JIG, AND METHOD FOR SETTING UP HEAT INSULATING LOAD JIG

(71) Applicants: NISSAN MOTOR CO., LTD., Yokohama-shi, Kanagawa (JP); Sanken Electric Co., Ltd.

(72) Inventors: Satoshi Tanimoto, Yokohama (JP); Yusuke Zushi, Tokyo (JP); Yoshinori Murakami, Yokohama (JP); Kohei Matsui, Hino (JP); Shinji Sato, Niiza (JP); Yu Fukushima, Yamanashi (JP)

(73) Assignees: NISSAN MOTOR CO., LTD., Yokohama-shi (JP); SANKEN ELECTRIC CO., LTD., Niiza-shi (JP)

( * ) Notice: Subject to any disclaimer, the term of this patent is extended or adjusted under 35 U.S.C. 154(b) by 235 days.

(21) Appl. No.: 14/395,876

(22) PCT Filed: Apr. 24, 2013

(86) PCT No.: PCT/JP2013/062101
§ 371 (c)(1),
(2) Date: Oct. 21, 2014

(87) PCT Pub. No.: WO2013/161892
PCT Pub. Date: Oct. 31, 2013

(65) Prior Publication Data
US 2015/0041525 A1 Feb. 12, 2015

(30) Foreign Application Priority Data
Apr. 27, 2012 (JP) .................... 2012-102954

(51) Int. Cl.
*H01L 23/00* (2006.01)
*B23K 37/04* (2006.01)
(Continued)

(52) U.S. Cl.
CPC .......... *H01L 24/83* (2013.01); *B23K 37/0426* (2013.01); *H01L 24/75* (2013.01);
(Continued)

(58) Field of Classification Search
CPC ............ B23K 3/087; H01L 2023/4081; H05K 2203/0195; H05K 2203/304
(Continued)

(56) References Cited

U.S. PATENT DOCUMENTS 4,872,604 A  10/1989  Zimmer
6,268,568 B1 *  7/2001  Kim .................. H01L 23/49816
                                                                                174/250
(Continued)

FOREIGN PATENT DOCUMENTS

JP   2-185055 A   7/1990
JP   7-22744 A    1/1995
(Continued)

OTHER PUBLICATIONS

S.K.Rhee, Pororsity—Thermal Conductivity Correlations for Ceramic Materials, Material Science and Engineering, vol. 20, 1975, pp. 89-93.
(Continued)

*Primary Examiner* — Erin B Saad
(74) *Attorney, Agent, or Firm* — Foley & Lardner LLP (57) ABSTRACT

In a heat insulating load jig 11 of the present invention, a solder material 14 having a melting point or a solidus temperature in a range between a thermal resistance temperature of a semiconductor chip 13 and a temperature 100° C. below the thermal resistance temperature is interposed
(Continued)

CONICAL SHAPE | INVERTED CONICAL SHAPE | THUMBTACK SHAPE (UPRIGHT) | THUMBTACK SHAPE (INVERTED) | NEEDLE SHAPE (INVERTED)

between a circuit board 12 and the semiconductor chip 13; a heat insulating body 17 is placed on an upper side of the semiconductor chip 13 in this state; a metal weight 16 is disposed on the heat insulating body 17; and load is applied to the semiconductor chip 13 while the solder material 14 is melted and solidified.

10 Claims, 8 Drawing Sheets

(51) Int. Cl.
  *H05K 3/34* (2006.01)
  *H05K 13/04* (2006.01)
(52) U.S. Cl.
  CPC .......... *H05K 3/34* (2013.01); *H05K 13/0465* (2013.01); *H01L 24/05* (2013.01); *H01L 24/29* (2013.01); *H01L 24/97* (2013.01); *H01L 2224/04026* (2013.01); *H01L 2224/05082* (2013.01); *H01L 2224/05155* (2013.01); *H01L 2224/05166* (2013.01); *H01L 2224/05639* (2013.01); *H01L 2224/2732* (2013.01); *H01L 2224/291* (2013.01); *H01L 2224/29118* (2013.01); *H01L 2224/29144* (2013.01); *H01L 2224/7531* (2013.01); *H01L 2224/7532* (2013.01); *H01L 2224/7598* (2013.01); *H01L 2224/75101* (2013.01); *H01L 2224/75305* (2013.01); *H01L 2224/75314* (2013.01); *H01L 2224/75315* (2013.01); *H01L 2224/75317* (2013.01); *H01L 2224/75756* (2013.01); *H01L 2224/75981* (2013.01); *H01L 2224/832* (2013.01); *H01L 2224/83022* (2013.01); *H01L 2224/83048* (2013.01); *H01L 2224/83075* (2013.01); *H01L 2224/83101* (2013.01); *H01L 2224/83211* (2013.01); *H01L 2224/83444* (2013.01); *H01L 2224/83447* (2013.01); *H01L 2224/83801* (2013.01); *H01L 2224/83815* (2013.01); *H01L 2224/97* (2013.01); *H01L 2924/014* (2013.01); *H01L 2924/01322* (2013.01); *H01L 2924/1033* (2013.01); *H01L 2924/1037* (2013.01); *H01L 2924/1067* (2013.01); *H01L 2924/10253* (2013.01); *H01L 2924/10254* (2013.01); *H01L 2924/10272* (2013.01); *H01L 2924/12032* (2013.01); *H01L 2924/12036* (2013.01); *H01L 2924/13062* (2013.01); *H01L 2924/13091* (2013.01); *H01L 2924/15724* (2013.01); *H01L 2924/15747* (2013.01); *H01L 2924/15787* (2013.01); *H01L 2924/3656* (2013.01); *H05K 3/3431* (2013.01); *H05K 2203/0195* (2013.01); *H05K 2203/0278* (2013.01)

(58) Field of Classification Search
  USPC .................. 228/44.3, 212; 257/719, 727
  See application file for complete search history.

(56) References Cited

U.S. PATENT DOCUMENTS

| 6,279,815 | B1* | 8/2001 | Correia ............. B23K 37/0408 |
| | | | 228/180.21 |
| 8,283,783 | B2 | 10/2012 | Yamada et al. |
| 2005/0034302 | A1 | 2/2005 | Hosotani et al. |
| 2006/0273141 | A1* | 12/2006 | Saito .................... B23K 1/0016 |
| | | | 228/234.1 |
| 2008/0054439 | A1 | 3/2008 | Malhan et al. |
| 2010/0193801 | A1 | 8/2010 | Yamada et al. |

FOREIGN PATENT DOCUMENTS

| JP | 10-163418 A | 6/1998 |
| JP | 2000-176653 A | 6/2000 |
| JP | 2005-223241 A | 8/2005 |
| JP | 2006-41316 A | 2/2006 |
| JP | 2007-95930 A | 4/2007 |
| JP | 2009-125753 A | 6/2009 |
| JP | 2009-267069 A | 11/2009 |

OTHER PUBLICATIONS

Ybin Xu et al., Effect of Microstructure on Au/Sapphire Interfacial Thermal Resistance, Journal of Applied Physics, vol. 108, No. 10, 2010, pp. 104317-1-104317-6.
Wikipedia, Thermal Contact Conductance, Feb. 26, 2012, retrieved from the internet: URL: https://en.wikipedia.org/w/index/php?.
Goro Izuta et al., Development of Transient Liquid Phase Soldeirng Process for LSI Die-Bonding, Proceedings of the Electronic Components and Technology Conference, IEEE, vol. CONF. 43, Jun. 1, 1993, pp. 1012-1016.
Satoshi Tanimoto et al., Assessment of Au—Ge Die Attachment for an Extended Junction Temperature Range in Power Applications, Imaps International Conference & Exhibition on High Temperature Electronics (HiTEC), 2010, pp. 32-39.
Y. Yamada et al, Reliability of Wire-Bonding and Solder Joint for High Temperature Operation of Power Semiconductor Device, Microelectronics Reliability, vol. 47, 2007, pp. 2147-2151.
Michael J. Palmer et al., SiC Power Switch Module, IMAPS International Conference & Exhibition on High Temperature Electronics (HiTEC), 2010, pp. 316-324.
Vemal Raja Manikam et al., Die Attach Materials for High Temperature Applications: A Review, IEEE Transactions on Components, Packaging and Manufacturing Technology, vol. 1, No. 4, Apr. 2011, pp. 457-478.

* cited by examiner

| CONICAL SHAPE | INVERTED CONICAL SHAPE | THUMBTACK SHAPE (UPRIGHT) | THUMBTACK SHAPE (INVERTED) | NEEDLE SHAPE (INVERTED) |

PRESENT INVENTION

PRIOR ART

METHOD FOR MANUFACTURING SEMICONDUCTOR DEVICE, HEAT INSULATING LOAD JIG, AND METHOD FOR SETTING UP HEAT INSULATING LOAD JIG

TECHNICAL FIELD

The present invention relates to a method for manufacturing a semiconductor device formed by bonding a semiconductor element and a substrate with a high-temperature solder bonding material, a heat insulating load jig used in bonding of the high-temperature solder material, and a method for setting up the heat insulating load jig.

BACKGROUND ART

Power semiconductor devices using wide-bandgap semiconductor such as silicon carbide (SiC), gallium nitride (GaN), and diamond (C) have lower on-resistance than those of conventional semiconductor devices using silicon (Si) and gallium arsenide (GaAs), and can perform high-voltage and high-current operations at a high semiconductor junction temperature (Tj). Accordingly, reduction of the area of the semiconductor device and drastic simplification of a cooler is achieved at the same time, and it is expected that a small, light-weight, low-cost power electronic system can be achieved.

A bonding portion (so-called die bond using solder) with an electrically-conductive substrate in such a power semiconductor device requires high heat resistance as a matter of course. In view of this, AuGe eutectic solder (melting point 356° C.), AuSi eutectic solder (melting point 363° C.), ZnAl eutectic solder (melting point 380° C.), and the like which have high melting points are considered to be used as solder materials in such a power semiconductor device (Non-patent Literatures 1 to 3 and Patent Literature 1).

However, when the bonding portion of the semiconductor device is formed by using the high-temperature solder materials described above, voids tend to be formed in a high-temperature solder layer as clearly shown in FIG. 6 of Non-patent Literature 1 and FIG. 8a of Non-Patent Literature 2, and reduction of these voids is a major development problem (first prior art).

A known method for suppressing formation of voids in the die bond solder is a method in which a metal weight is placed on the semiconductor device and the semiconductor device is heated in this state to reflow the solder. FIG. 22 of Non-patent Literature 3 can be given as a specific example of the most sophisticated solder jig (second prior art).

CITATION LIST

Patent Literature

Patent Literature 1: Japanese Patent Application Publication No. 2009-125753

Non-Patent Literature

Non-patent Literature 1: S. Tanimoto el al, Proceedings of IMAPS HiTEC 2010 (May 11-13, 2010, Albuquerque, N. Mex., USA), pp. 32-39.
Non-patent Literature 2: Y. Yamada el al, Microelectronics Reliability Vol. 47 (2007) pp. 2147-2151.
Non-patent Literature 3: Michael J. Palmer al, Proceedings of IMAPS HiTEC 2010 (May 11-13, 2010, Albuquerque, N. Mex., USA), pp. 316-324.

SUMMARY OF INVENTION

If the power semiconductor device and the substrate are bonded to each other with the high-temperature solder by using the aforementioned second prior art, although the voids can be reduced, the power semiconductor device is thermally damaged and this causes many defects and deterioration in reliability. Accordingly, the second prior art has a problem that the power semiconductor device cannot be practically used. Defect modes (or deterioration in reliability) in this case include short circuit between a gate and a source (a base and an emitter), defective insulation, deterioration in the withstanding voltage of a gate insulating film, and the like.

The present invention is proposed in view of the circumstances described above, and a first object of the present invention is to provide a high-temperature solder void reduction technique which causes no thermal damage. Moreover, a second object of the present invention is to achieve a high-temperature solder die bond and a power semiconductor device in which voids are reduced by using this improved technique.

In the present invention, a circuit board and a semiconductor chip are bonded to each other by: interposing a solder material between the circuit board and the semiconductor chip, the solder material having a melting point or a solidus temperature in a range between a heatproof temperature of the semiconductor chip and a temperature 100° C. below the heatproof temperature; and melting and solidifying the solder material with load applied to the semiconductor chip from above via a heat insulating body. The present invention can thereby achieve the two objects described above.

DESCRIPTION OF EMBODIMENTS

First to fifth embodiments to which the present invention is applied are described below with reference to the drawings.

First Embodiment

The first embodiment of a method for manufacturing a semiconductor device which uses a heat insulating load jig of the present invention is described with reference to FIGS. 1 to 4. Note that these drawings are schematically illustrated to facilitate the understanding of the present invention, and relationships between thicknesses and plan dimensions, ratios of thicknesses between layers, and the like are illustrated in an exaggerated manner.

Moreover, the first embodiment is described below by giving an example in which a SiC power chip is used as a semiconductor device, a circuit board (hereafter, simply referred to as board in some cases) in which Cu plates are attached as circuit electrical conductors on both surfaces of a SiN ceramic plate is used as a circuit board, and AuGe eutectic solder is used as high-temperature solder. However, this is merely an example, and the present invention can be equally applied to cases where other wide-bandgap semiconductor elements such as a GaN element, a diamond element, and a ZnO element, as well as Si semiconductor elements for high temperature usage (a power element, a SOI element, and a sensor element) are used as the semiconductor power device. Moreover, the circuit conductors are not limited to the Cu plates attached to the SiN ceramic plate and may be Cu-based material attached to a different type of ceramic substrate or metal plates (Al, CuMo, or the like) other than the Cu plates attached to a different type of ceramic substrate ($Al_2O_3$, AlN, or the like) or an insulating body. Alternatively, the circuit conductors may be Cu plates or simple metal plates made of an elemental metal (without the ceramic plate or the insulating plate) other than Cu (in this case, the metal plate itself is the circuit board). Moreover, the high-temperature solder can be defined as solder having a melting point or a solidus temperature in a range between a heatproof temperature of the used semiconductor device and a temperature 100° C. below the heatproof temperature, and may be Au—Si, Zn—Al, or other materials.

[Configuration of Reflow Equipment]

An overall configuration of a high-temperature solder bond forming apparatus used in the present invention is described.

Figure 1:
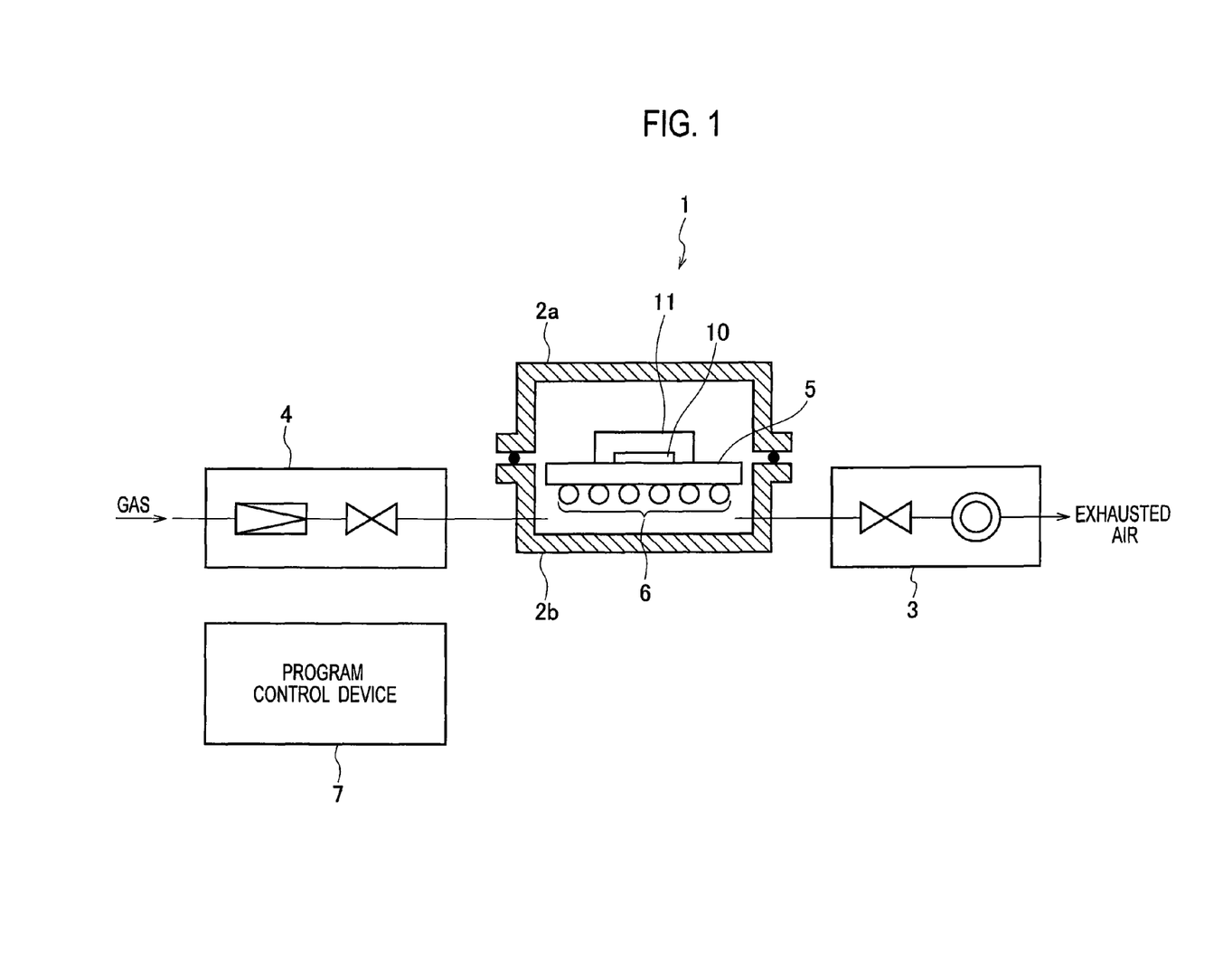
FIG. 1 is a block diagram showing a configuration of a reflow equipment in which a heat insulating load jig of the present invention is used.

FIG. 1 is a schematic cross-sectional diagram of a main portion of a bonding apparatus in which the heat insulating load jig of the present invention is used. Reference numeral 1 denotes a general-purpose reflow equipment, and the reflow equipment 1 includes sealed chambers 2a, 2b, an exhaust device 3 configured to reduce the pressure inside the chamber, and a gas supplying device 4 configured to deliver an inert gas (Ar or $N_2$) with low dew point into the chamber. A horizontally-placed susceptor 5 made of carbon or Al and a lamp heater 6 capable of rapidly heating the susceptor 5 are placed inside the chamber. The atmosphere inside the chamber and the temperature of the susceptor 5 are controlled by a program control device 7.

A bonding sample 10 is placed on the susceptor 5, and a heat insulating load jig 11 configured to apply load to the bonding sample 10 in a thermally-insulated manner is placed on the bonding sample 10.

Figure 2:
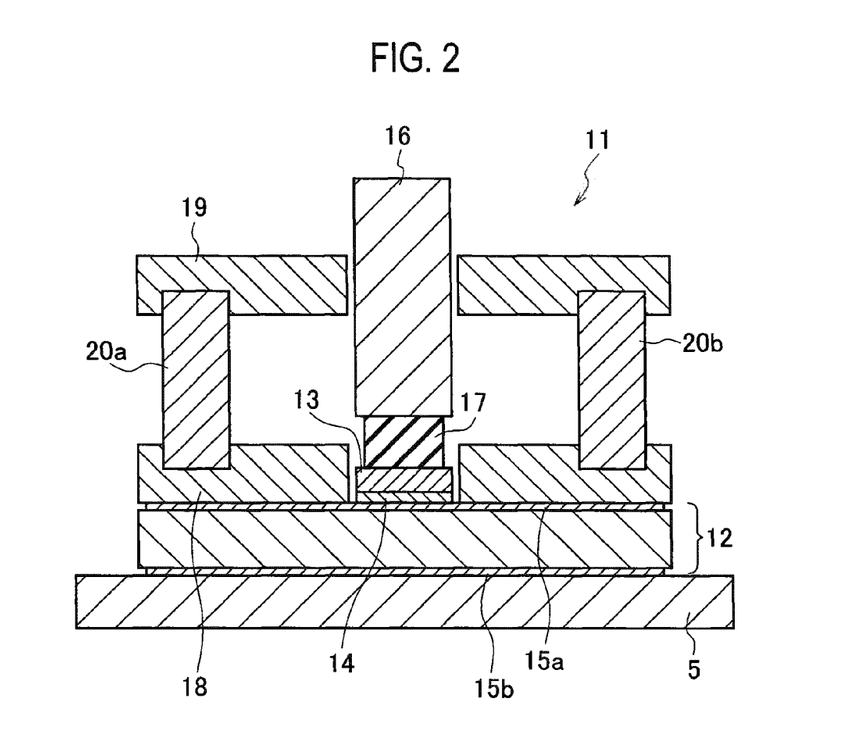
FIG. 2 is a cross-sectional diagram showing a structure of a heat insulating load jig in a first embodiment of the present invention.

FIG. 2 is a detailed diagram of the bonding sample 10 and the heat insulating load jig 11 and shows a state before bonding.

The bonding sample 10 is formed of a SiN (silicon nitride) substrate 12 placed to come into contact with the susceptor 5, a SiC power chip 13, an AuGe eutectic solder sheet (or paste) 14 held between the SiN substrate 12 and the SiC power chip 13. Cu circuit plates 15a, 15b are attached to both surfaces of the SiN substrate 12 by using silver solder or the like (not illustrated). Surfaces of the Cu circuit plates 15a, 15b are plated with Ni/Au (not illustrated). Coating on the surfaces of the Cu circuit plates 15a, 15b is changed as appropriate depending on the type of the high-temperature solder. For example, in a case of ZnAl eutectic solder, Ni/Cu plating is preferably formed. Moreover, a back surface, i.e. bonding surface, of the SiC power chip 13 is coated with metallization (not illustrated) for normal solder such as Ti/Ni/Ag.

Meanwhile, the heat insulating load jig 11 is formed at least of a metal weight 16 made of metal and having a pillar shape (circular column shape or prismatic column shape) and a heat insulating body 17 disposed between the metal weight 16 and the SiC power chip 13. A chip alignment plate 18, a weight supporting plate 19, and connection columns 20a, 20b, . . . can be provided as needed.

A metal weight (metal load means) 16 acts as a source of load applied to the SiC power chip 13, like the metal weight in the prior art. Load equal to that in the prior art can be applied to the SiC power chip 13 via the heat insulating body 17. The shape of the metal weight 16 is preferably a circular column or a polygonal column which are such shapes that a dynamic balance can be easily achieved, but is not limited to these shapes. The weight of the metal weight 16 is determined such that chip load (pressure) is at least 0.1 $g/cm^2$ or more, preferably 0.3 $g/cm^2$ or more.

The heat insulating body (heat insulating means) 17 has a function of blocking (to be precise, strongly suppressing) heat conduction between the SiC power chip 13 and the metal weight 16. Specifically, the heat insulating body 17 blocks transfer of heat from the SiC power chip 13 to the metal weight 16 when the temperature of the SiC power chip 13 is high and blocks transfer of heat in a reverse direction when the temperature of the metal weight 16 is high. Such heat insulating function of the heat insulating body 17 allows the SiC power chip 13 to be rapidly heated and rapidly cooled along with change in the temperature of the susceptor 5, without being thermally affected by the metal weight 16 whose heat capacity is very large. The material of the heat insulating body 17 is preferably alumina or an insulating body (for example, steatite porcelain, borosilicate glass, or the like) which has a lower thermal conductivity than alumina and which can sufficiently withstand the reflow temperature. The shape of the heat insulating body 17 may be a simple pellet of a flat circular-column shape or a flat polygonal-column shape as shown in FIG. 2 as an example.

Figure 3:
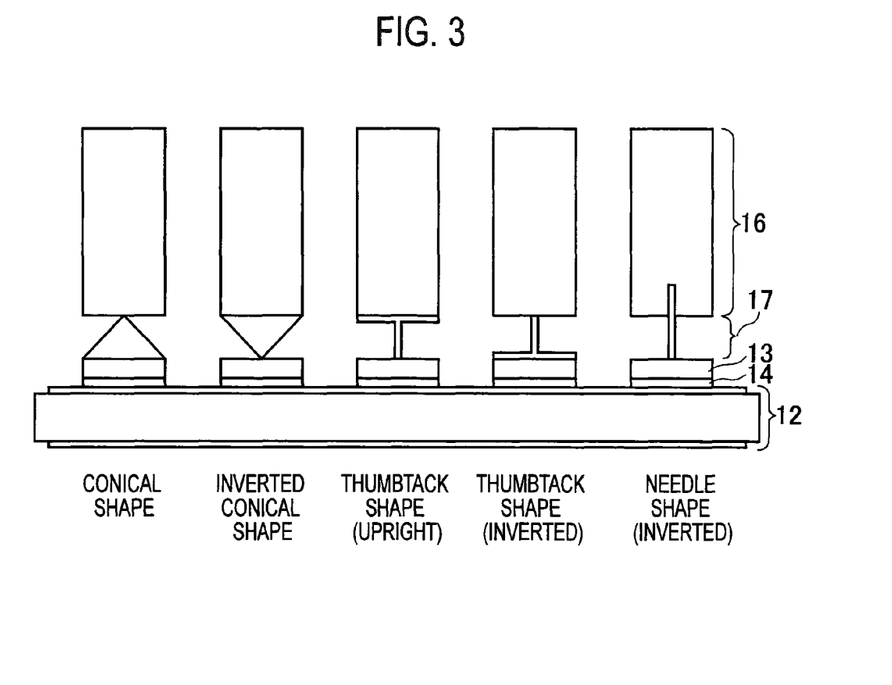
FIG. 3 is a diagram showing a structure of a heat insulating body in a heat insulating load jig of the present invention.

However, it is preferable that the heat insulating body 17 has a shape which limits the heat conduction between the SiC power chip 13 and the metal weight 16 to further improve the heat insulating effect. As such a structure, the heat insulating body 17 has a thin shaft structure in at least one portion of a heat transmission route extending from the SiC power chip 13 to the metal weight 16. Examples of such a structure include a conical shape (circular conical shape and polygonal pyramid shape), an inverted conical shape, a thumbtack shape (inverted and upright), a needle shape, and the like as shown in FIG. 3. Note that tips of the inverted conical shape, the inverted thumbtack shape, and the inverted needle shape are formed to be round to have R of about 100 μm so as not to damage surface electrodes of the SiC power chip 13. Moreover, making the structure of the heat insulating body 17 porous (like pumice) is also very effective. Furthermore, making contact surfaces of the heat insulating body 17 with SiC power chip 13 and the metal weight 16 coarse is also considerably effective.

The heat insulating body 17 and the metal weight 16 may be integrated as a heat insulator load (heat insulating load means).

The chip alignment plate (chip alignment means) 18 (FIG. 2) has a function of alignment with the SiN substrate 12, and has a chip through hole for arranging the solder sheet and the SiC power chip at a predetermined position of the SiN substrate 12. The chip alignment plate 18 is made of a material with small heat capacity such as graphite or alumina and mainly functions as a template for arranging the SiC power chip 13 at the predetermined position of the SiN substrate 12. The chip alignment plate 18 is positioned by uniquely fitting the SiN substrate 12 to a recess portion carved on a bottom surface of the chip alignment plate 18. The chip through hole is opened at a position where the SiC power chip 13 is to be disposed (a position on the Cu circuit plate 15a in any cases), and is slightly larger than the SiC power chip 13.

The weight supporting plate (weight supporting means) 19 is arranged above and away from the chip alignment plate 18 by a predetermined distance. The weight supporting plate 19 has a function of alignment with the chip alignment plate 18 or the SiN substrate 12, and has a weight through hole at a position corresponding to the position of the chip through hole. Like the chip alignment plate 18, the weight supporting plate 19 is also made of a material with small heat capacity (graphite, alumina, or the like) and has a function of determining a position where the metal weight 16 is to be placed and a function of preventing tip-over of the metal weight 16 in bonding processing.

The connection columns 20a, 20b, . . . are members which connect and fix the chip alignment plate 18 and the weight supporting plate 19 to each other in a predetermined positional relationship. To achieve this function, insertion holes into which the connection columns can be inserted without a gap are provided at predetermined positions in the weight supporting plate 19 and the chip alignment plate 18. In order to improve operability in attachment of the heat insulating load jig 11, it is desirable to fixedly connect the weight supporting plate 19 and the connection columns 20a, 20b, . . . and detachably connect the chip alignment plate 18 and the connection columns 20a, 20b, . . . , or vice versa.

[Method for Setting Up Heat Insulating Load Jig]

Figure 4:
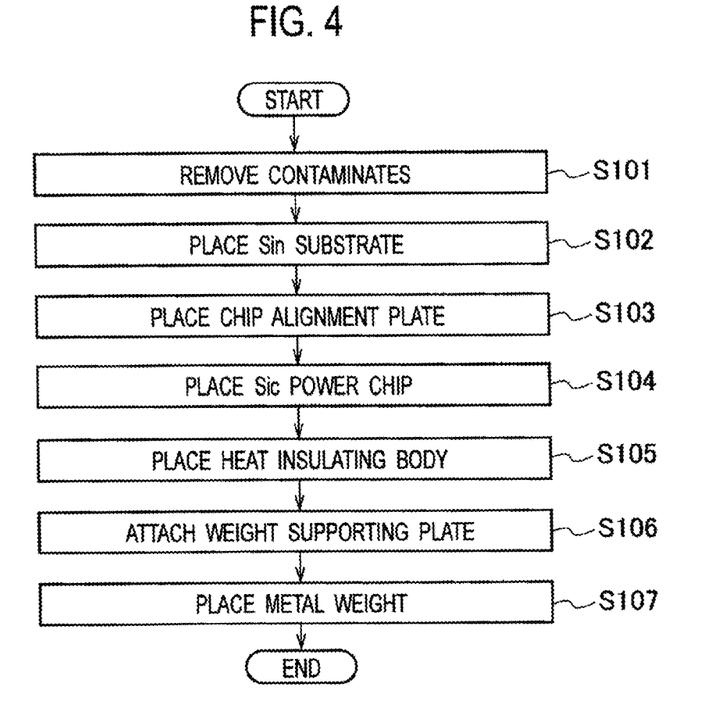
FIG. 4 is a flowchart showing procedures of a method for setting up the heat insulating load jig in the first embodiment of the present invention.

Next, a method for setting up the heat insulating load jig used in the aforementioned high-temperature solder bonding apparatus is described with reference to FIG. 4.

First, in step S101, required numbers of the SiC power chips 13 and the SiN (silicon nitride) substrates 12 are prepared and are cleaned by using organic solution such as acetone or isopropyl alcohol to remove contaminants adhering to surfaces of these precursor materials. Here, the SiC power chips 13 are SiC power semiconductor elements desired to be used together, and there are prepared power chips such as MOSFET, JFET, and BJT, power chips such as a Schottky diode and a pn diode, and the like which are required.

Next, in step S102, the chamber 2a of the reflow equipment 1 of FIG. 1 is opened to place the SiN substrate 12 on the susceptor 5 (FIG. 2). Then, in step S103, the chip alignment plate 18 is placed on the SiN substrate 12 while being aligned therewith. After the chip alignment plate 18 is placed, next, in step S104, the AuGe eutectic solder sheet 14 and the SiC power chip 13 are placed by being sequentially dropped into the chip through hole which is an opening portion provided in the chip alignment plate 18. Then, in step S105, the heat insulating body 17 is placed on the SiC power chip 13. In this case, the SiC power chip 13 is placed such that the bonding surface (back surface) thereof comes into contact with the AuGe eutectic solder sheet 14, as a matter of course. In a case where the heat insulating body 17 and the metal weight 16 are integrated with each other, the heat insulating body 17 is placed together with the metal weight 16 at the time when the metal weight 16 is placed later.

Next, in step S106, the weight supporting plate 19 to which the connection columns 20a, 20b, . . . are inserted is attached to the chip alignment plate 18. This attachment is executed by correctly inserting the connection columns 20a, 20b, . . . into predetermined holes carved in the chip alignment plate 18.

Lastly, in S107, the metal weight 16 is placed on the heat insulating body 17 through the weight through hole of the weight supporting plate 19, and the set-up of the heat insulating load jig 11 is thus finished.

[Processing in Reflow Process]

Next, after the aforementioned set-up of the heat insulating load jig 11 is completed, the chamber 2a of the reflow equipment 1 of FIG. 1 is closed to execute the reflow process.

Figure 5:
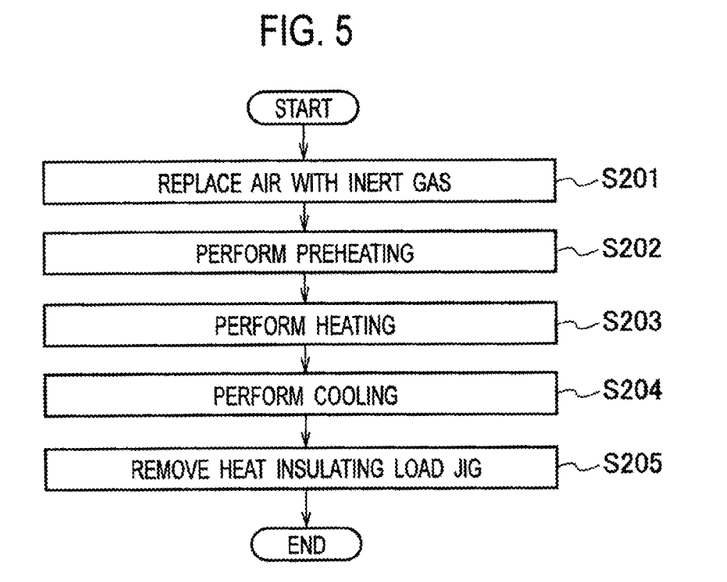
FIG. 5 is a flowchart showing procedures of a reflow process using the heat insulating load jig of the present invention.

Processing in the reflow process is described below with reference to FIG. 5. Note that temperature control, gas delivery control, and exhaust control in the reflow process are performed based on instructions from the aforementioned program control device 7.

First, in step S201, the exhaust device 3 of the reflow equipment 1 is activated to exhaust air inside the chambers 2a, 2b. When the pressure inside the chambers 2a, 2b becomes equal to or less than 5 millibar, the inert gas with low dew point is introduced from the gas supplying device 4. This operation is performed several times to replace the air inside the sample chamber with the inert gas.

After the replacement with the inert gas is completed, preheating is subsequently performed in step S202. The lamp heater 6 is powered up to heat the susceptor 5, and the temperature of the SiN substrate 12 and the SiC power chip 13 is raised to about 200° C. This temperature is maintained for about two minutes. In this case, removal of organic contaminations may be promoted by introducing an inert gas including formic acid vapor.

Then, in step S203, the introduction of the inert gas is stopped, and the exhaust device 3 is activated to exhaust air inside the chambers 2a, 2b and reduce the pressure inside the chambers 2a, 2b to a pressure equal to or less than 5 millibar. In addition, the power supplied to the lamp heater 6 is increased to further heat the susceptor 5, and the temperature of the SiN substrate 12 and the SiC power chip 13 is raised to and maintained at a predetermined temperature in a temperature range between the solidus temperature of the high-temperature solder (in the case of AuGe, 356° C.=melting point) and the maximum temperature of 420° C. The time maintained at the predetermined temperature is five minutes at the longest. For example, in the case where the AuGe solder is used and the predetermined temperature is set to 400° C., the time maintained at the predetermined temperature is typically one minute. When the temperature exceeds the melting point (356° C.), the AuGe solder turns into melt and is crushed by the load of the heat insulating load jig 11. In this case, air bubbles formed by remaining gas and the like are moved outside the solder layer and minimized due to combination of an effect of the reduced pressure and an effect of the high temperature.

Next, in step S204, the inert gas is introduced into the chambers 2a, 2b maintained in the reduced pressure state, and cooling of the susceptor 5, the SiN substrate 12, and the SiC power chip 13 is immediately started. In this short time after the introduction of the inert gas, the air bubbles remaining in the AuGe solder melt become extremely small due to an increase of external pressure and a rapid decrease of the temperature, and the AuGe solder melt solidifies in this state. Accordingly, an AuGe bonding layer with few voids formed due to air bubbles can be formed.

Moreover, since the SiC power chip 13 is in contact with the metal weight 16 with high heat capacity with the heat insulating body 17 provided therebetween, it is possible to cool the SiC power chip 13 more rapidly than in the prior arts, and reduce voids formed due to solid phase alloy reaction (Kirkendall reaction) between the AuGe solder layer and each of the solder metallization of the SiC power chip 13 and the plating layer of the Cu—SiN substrate Cu circuit plate 15a.

After the susceptor 5, the SiN substrate 12, and the SiC power chip 13 are cooled down to a room temperature, in step S205, the chamber 2a is opened, the heat insulating load jig 11 is removed, and the bonding sample 10 (=SiC power chip/SiN substrate bonded body) is taken out. A high-temperature solder bonded semiconductor device is thus completed, and the reflow process of the embodiment is finished.

Effects of First Embodiment

As described above in detail, since the heat insulating load jig of the embodiment is configured to apply load to the semiconductor device from above via the heat insulating body, the semiconductor device and the load are thermally insulated from each other, and it is possible to achieve rapid heating, melting of the solder in a short time, and rapid cooling. This can not only reduce voids but also avoid excessive temperature rise and long-time heat treatment and practically eliminate thermal damage to the semiconductor device. As a result, a highly-reliable power semiconductor device bonded by using high-temperature solder with few voids can be obtained in a high yield.

Figure 6:
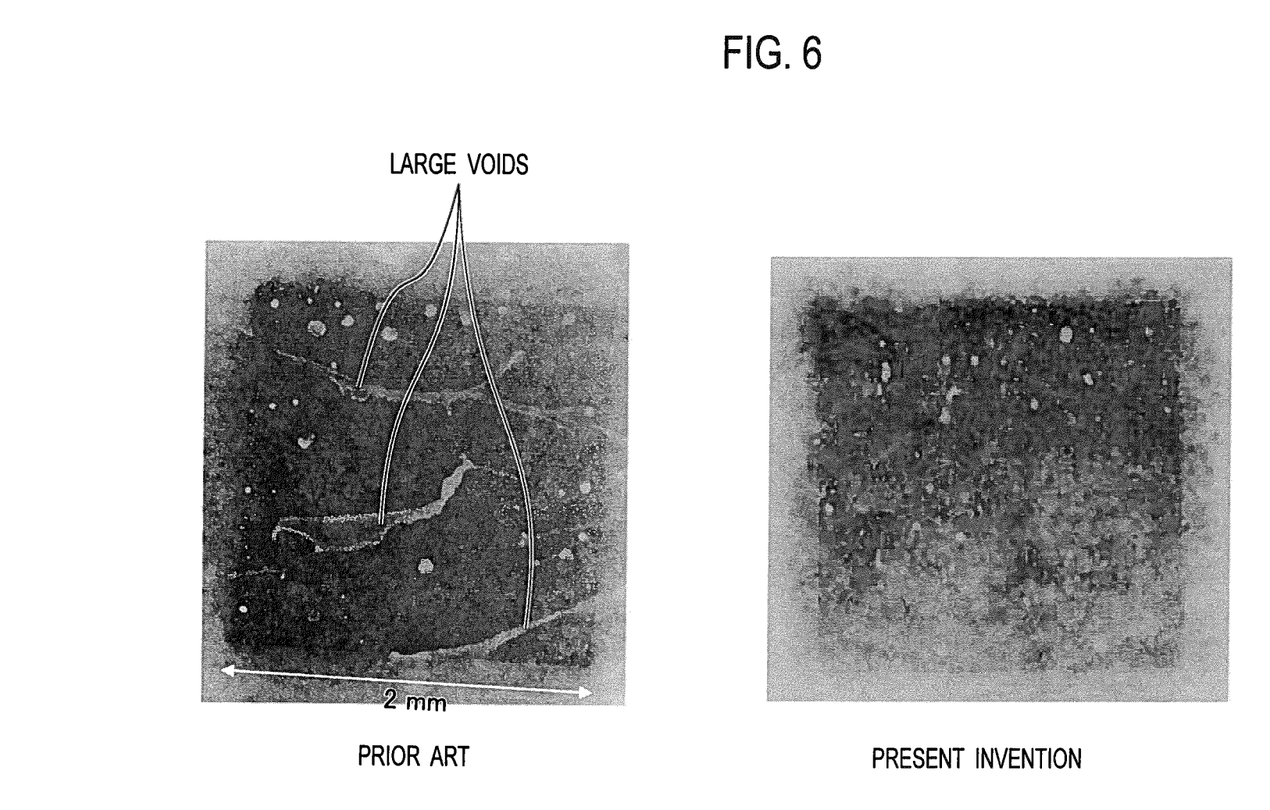
FIG. 6 is a diagram for explaining effects obtained by a method for manufacturing a semiconductor device which uses the heat insulating load jig of the present invention.

Effects of the heat insulating load jig of the embodiment are described below in detail with reference to FIG. 6. FIG. 6 shows typical microfocused transmission X-ray pictures comparing the high-temperature solder (AuGe) bonded semiconductor device manufactured in the embodiment and a high-temperature solder bonded semiconductor device obtained in the first prior art (method using no weight). The dimensions of the SiC chips appearing as square objects in the pictures are 2×2 mm². Portions appearing relatively white in the pictures in terms of contrast are voids existing in high-temperature solder layers.

Comparing these pictures, difference is apparent. According to the high-temperature solder bonded semiconductor device and the method for manufacturing the same of the embodiment, an area occupied by the voids is reduced by one tenth or lower compared to the high-temperature solder bonded semiconductor device based on the first prior art. In the embodiment, the percentage of area occupied by the voids is 5% at maximum and is typically less than 2% (right picture of FIG. 6). The semiconductor device with no void at all can be also obtained at a high rate. This result is the same for other embodiments described below.

From the facts described above, it can be said that the high-temperature solder bonded semiconductor device and the method for manufacturing the same of the present invention solve the problem of the first prior art, specifically "void tends to be formed in the high-temperature solder layer".

Thirty high-temperature solder (AuGe) bonded semiconductor devices based on the present invention and another thirty devices based on the second prior art were manufactured under a condition where the formation of voids was reduced. In a characteristic test, the semiconductor devices based on the present invention were all good products. Meanwhile, 21 semiconductor devices based on the second prior art were defective products and nine were good products. Defect modes were insufficient withstanding voltage and short circuit between a gate and a source. Next, the thirty semiconductor devices based on the present invention and the nine good semiconductor devices based on the second prior art were subjected to heat exposure test at 300° C. All of the semiconductor devices based on the second prior art became defective within 100 hours. Meanwhile, all of the semiconductor devices based on the present invention survived the 3000-hour test and no defect occurred.

From the facts described above, it can be said that the high-temperature solder bonded semiconductor device and the method for manufacturing the same of the present invention solve the problem of the second prior art, specifically "since the power semiconductor device is thermally damaged in the solder bonding process and this causes many defects and deterioration in reliability, the power semiconductor device cannot be practically used".

As described above, in the high-temperature solder bonded semiconductor device and the method for manufacturing the same of the present invention, the highly-reliable high-temperature solder bonded power semiconductor device with reduced voids can be provided in a high yield.

Next, description is given of how the high-temperature solder bonded semiconductor device and the method for manufacturing the same of the present invention can prevent defects and deterioration of reliability.

It is known that the reflow temperature in solder bonding is empirically set to about 50° C. above the melting point (or the solidus temperature) in consideration of manufacturing. In the case of AuGe, the reflow temperature is 406° C., in the case of AuSi, 413° C., and in the case of ZnAl solder, 430° C. Meanwhile, the thermal resistance of the current SiC power chip, which is formed by a Si semiconductor fabrication technique, in fabrication is such a level that the SiC power chip can withstand heat of 420° C. for several tens of minutes. The inventors of the present invention, who noticed that there is almost no margin between the recommended reflow temperature for the high-temperature solder and the heatproof temperature of the power chip, focused on temperature history of the second prior art and obtained the following important finding based on an experiment.

In the second prior art, i.e. a high-temperature solder bonding process in a method for manufacturing a semiconductor device described in Non-patent Literature 3, the SiC power chip is configured to directly come into contact with the metal weight with large heat capacity. Accordingly, it is difficult to raise the temperature and, if the temperature is raised to reach a predetermined temperature in a short time, the temperature at the position of the SiC power chip overshoots and exceeds the heatproof temperature, thereby causing damage or severe deterioration of the SiC power chip. If the temperature is made to rise in a long time to alleviate this problem, no overshooting occurs. However, the SiC power chip is kept near the predetermined reflow temperature for a very long time, and the chip is thermally damaged also in this case. Another reason why thermal damage occurs is that the metal weight once heated to a high temperature becomes a heat supply source in a cooling step after the reflow, and temperature fall of the SiC power chip is hindered.

In view of this, the inventors understanding such mechanism of thermal damage have worked hard to come up with the present invention. Specifically, in the high-temperature solder bonding process in the method for manufacturing the high-temperature solder bonded semiconductor device of the present invention, a configuration is such that the load of the metal weight 16 is applied to the SiC power chip 13 via the heat insulating body 17. Accordingly, the SiC power chip 13 and the metal weight 16 are thermally insulated from each other, and the metal weight 16 is not heated to a high temperature in the reflow process. Hence, the temperature can be rapidly raised and rapidly lowered under a condition where no temperature overshooting occurs. Moreover, it is possible to eliminate the risk of the SiC power chip being kept near the reflow temperature for a long time. The high-temperature solder bonded semiconductor device and the method for manufacturing the same of the present invention have thus succeeded in solving the serious problem of the second prior art, specifically "the power semiconductor device is thermally damaged in the solder bonding process and this causes many defects".

Moreover, since the heat insulating load jig of the embodiment includes the connection columns 20a, 20b, . . . detachably connecting the chip alignment plate 18 and the weight supporting plate 19 to each other, the chip alignment plate 18 and the weight supporting plate 19 can be connected and fixed to each other in the predetermined positional relationship.

Furthermore, in the heat insulating load jig of the embodiment, since the connection columns 20a, 20b, . . . are fixed to the chip alignment plate 18 or the weight supporting plate 19, operability in attachment can be improved.

Moreover, in the heat insulating load jig of the embodiment, the heat insulating body 17 has the thin shaft structure in at least one portion of the heat transmission route extending from the SiC power chip 13 to the metal weight 16. Accordingly, the heat insulating effect between the SiC power chip 13 and the metal weight 16 can be further improved.

Furthermore, in the heat insulating load jig of the embodiment, since the heat insulating body 17 has the porous structure, the heat insulating effect between the SiC power chip 13 and the metal weight 16 can be improved.

Moreover, in the heat insulating load jig of the embodiment, since the heat insulating body 17 has a coarse structure in at least one of the contact surfaces with the SiC power chip 13 and the metal weight 16, the heat insulating effect between the SiC power chip 13 and the metal weight 16 can be improved.

Furthermore, in the heat insulating load jig of the embodiment, since the mass of the metal weight 16 is set such that pressure of 0.1 g/cm$^2$ or more is generated at the solder bonding surface of the SiC power chip 13, voids can be effectively reduced.

Moreover, in the heat insulating load jig of the embodiment, since the mass of the metal weight 16 is set such that pressure of 0.3 g/cm$^2$ or more is generated at the solder bonding surface of the SiC power chip 13, voids can be more effectively reduced.

Second Embodiment

Next, the second embodiment of the present invention is described. Since the second embodiment is an invention related to a modification of the heat insulating load jig 11 of the first embodiment, only the description related to the heat insulating load jig is given and description of other parts is omitted.

[Configuration of Heat Insulating Load Jig]

Figure 7:
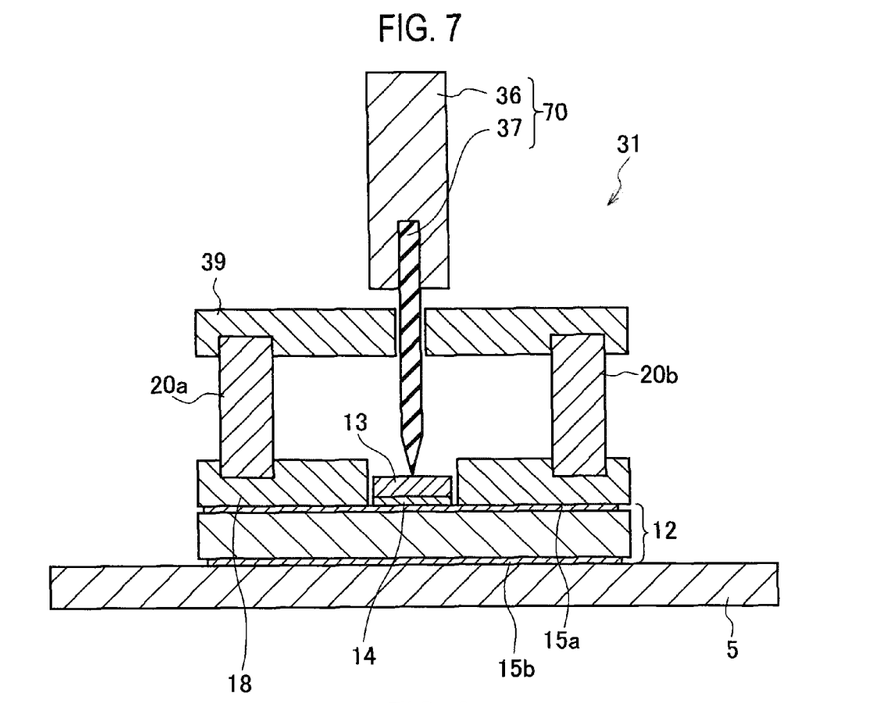
FIG. 7 is a cross-sectional diagram showing a structure of a heat insulating load jig in a second embodiment of the present invention.

FIG. 7 shows a cross-section of a main portion of a heat insulating load jig 31 of the second embodiment. Constitutional elements same as those in FIG. 2 are denoted by the same reference numerals as FIG. 2, and description thereof is omitted to avoid overlapping description. Reference numeral 39 denotes a weight supporting plate, 37 denotes a bar-shaped heat insulating body, and 36 denotes a metal weight.

Detailed description is given by focusing on differences with the first embodiment. The heat insulating body 37 is longer than that in the first embodiment, and an end of a surface coming into contact with the SiC power chip 13 is curved to have a conical shape. The heat insulating body 37 protrudes upward from an opening portion of the weight supporting plate 39 and is inserted into a hole provided in a bottom portion of the metal weight 36. The heat insulating body 37 has a role of transmitting load to the SiC power chip 13 and blocking heat exchange between the SiC power chip 13 and the metal weight 36.

Note that, it is preferable that the heat insulating body 37 is fixed to the metal weight 36 to facilitate attachment and detachment of the heat insulating load jig 31. The method for fixing the heat insulating body 37 is simple. For example, a small screw hole is formed in a lower surface of the metal weight 36, and the heat insulating body 37 is fixed by a set screw. In the embodiment, the heat insulating body 37 and the metal weight 36 are integrated and used as a heat insulator load 70. This can improve operability in attachment.

The weight supporting plate 39 is made of a material with small heat capacity (such as graphite or alumina) and has a function of determining a placement position of the metal weight 36 and a function of maintaining a vertical posture of the metal weight 36 in bonding processing. To achieve these functions, the weight supporting plate 39 is provided with a weight through hole through which only the heat insulating body 37 passes and insertion holes for fixing the connection columns 20a, 20b, . . . at predetermined positions. In order to improve operability in attachment, it is desirable to fixedly connect the weight supporting plate 39 and the connection columns 20a, 20b, . . . and detachably connect the chip alignment plate 18 and the connection columns 20a, 20b, . . . , or vice versa. In the embodiment, the case where the weight supporting plate 39 and the connection columns 20a, 20b, . . . are integrated together is described below for the convenience of description.

As is apparent from the aforementioned description of the structure, in the embodiment, since the heat insulating body 37 is long and narrow and the surface of the heat insulating body 37 coming into contact with the SiC power chip 13 is processed in the conical shape, the heat insulating property is further improved compared to the heat insulating body 17 of the first embodiment. Accordingly, the embodiment can have a higher effect of solving the problem of the second prior art, specifically "since the power semiconductor device is thermally damaged in the solder bonding process and this causes many defects and deterioration in reliability, the power semiconductor device cannot be practically used".

[Method for Setting Up Heat Insulating Load Jig]

Figure 8:
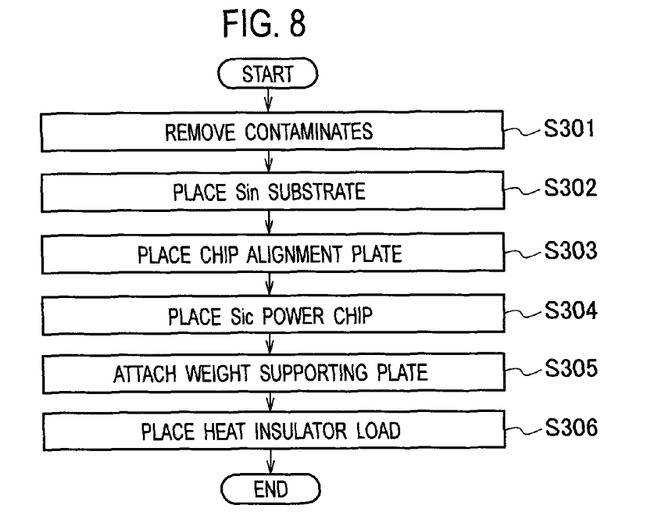
FIG. 8 is a flowchart showing procedures of a method for setting up the heat insulating load jig in the second embodiment of the present invention.

Next, a method for setting up the heat insulating load jig 31 for high-temperature solder bonding is described with reference to FIG. 8.

As in the first embodiment, after contaminants are removed (S301), the SiN substrate 12 is placed on the susceptor 5 (S302), and the chip alignment plate 18 is placed on the SiN substrate 12 while being aligned therewith (S303). Thereafter, the AuGe eutectic solder sheet 14 and the SiC power chip 13 are sequentially dropped into the opening portion provided in the chip alignment plate 18 (S304).

Then, in step S305, the weight supporting plate 39 to which the connection columns 20a, 20b, . . . are fixed is placed on the chip alignment plate 18 while being aligned therewith. Then, in step S306, the heat insulator load 70 obtained by integrating the heat insulating body 37 and the metal weight 36 is inserted into the weight through hole of the weight supporting plate 39. The set-up of the heat insulating load jig 31 is thus completed as shown in FIG. 7.

Thereafter, by performing the reflow process as described in the first embodiment, the method for manufacturing the SiC semiconductor device of the present invention is finished and the SiC semiconductor device based on the present invention is completed.

In the aforementioned method, description is given of work including two steps of placing the weight supporting plate 39 and then placing the metal weight 36. However, the work of placing the weight supporting plate 39 and the metal weight 36 in the chip alignment plate 18 can be completed in one step by assembling an assembly in which the metal weight 36 is inserted into the weight supporting plate 39 before the work. Moreover, this is the same for removal work.

As described above, the second embodiment of the present invention can exert such an excellent effect that, in the fabrication process, attachment and detachment of the heat insulating load jig can be performed more easily than in the first embodiment.

Third Embodiment

The heat insulating load jigs of the first and second embodiments are configured such that the metal load which is heavy in weight protrudes outward above the chip alignment plate, the weight supporting plate, and the connection columns which are relatively light in weight. Accordingly, the center of gravity is high and, in a case where the weight of the metal weight is heavy or a case where multiple metal weights are attached for one SiN substrate, great care is needed to be taken not to tip over the heat insulating load jig and the SiN substrate 12. In mass production using a mass production apparatus employing a mode in which the susceptor 5 moves like a conveyor or a mass production apparatus configured to place the heat insulating load jig with a robot, this characteristic causes a problem that the speed of the conveyor or the speed of an arm of the robot cannot be increased.

In view of this, an object of the third embodiment is to solve such a problem of the heat insulating load jigs of the first and second embodiments and improve productivity.

Figure 9:
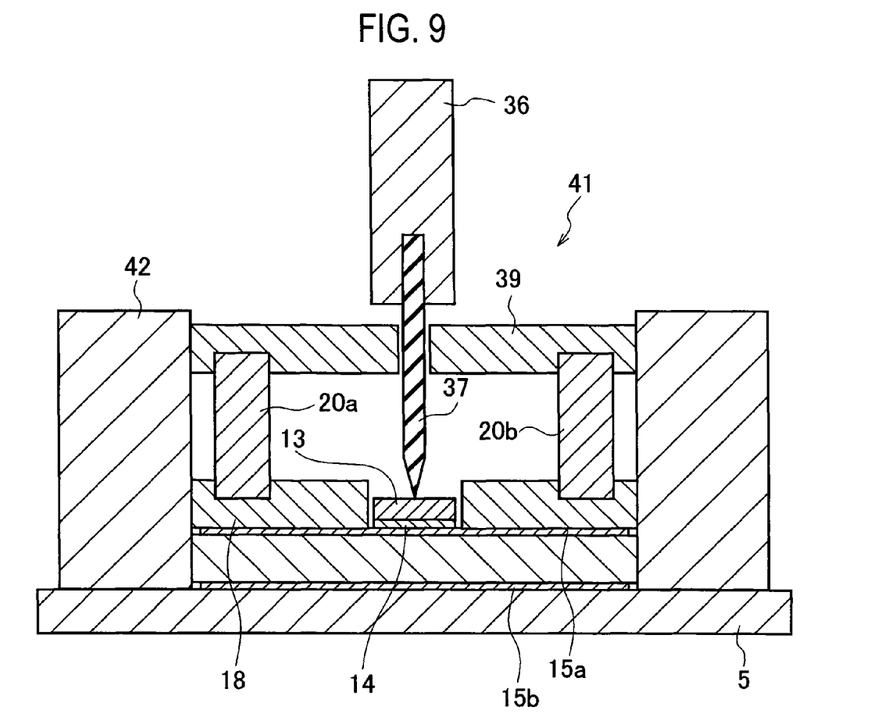
FIG. 9 is a cross-sectional diagram showing a structure of a heat insulating load jig in a third embodiment of the present invention.

FIG. 9 shows a cross section of a main portion of a heat insulating load jig 41 based on the third embodiment. The embodiment is described as a case where the heat insulating load jig 31 of the second embodiment (FIG. 7) is modified to stabilize the center of gravity. However, the embodiment can be similarly applied to the heat insulating load jig 11 of the first embodiment. Constitutional elements same as those in FIG. 7 are denoted by the same reference numerals as FIG. 7, and description thereof is omitted to avoid overlapping description.

In FIG. 9, reference numeral 42 denotes a center-of-gravity stabilizing frame placed on the susceptor 5, and the center-of-gravity stabilizing frame 42 has a shape like "a box without top and bottom surfaces". An inner wall of the center-of-gravity stabilizing frame 42 comes into contact with any one of a set of the SiN substrate 12 and the weight supporting plate 39, a set of the chip alignment plate 18 and the weight supporting plate 39, and a set of the SiN substrate 12, the chip alignment plate 18, and the weight supporting plate 39 with a small clearance provided Although, the center-of-gravity stabilizing frame 42 is illustrated as a simple frame in FIG. 9, an effect of further stabilizing the center of gravity can be obtained by forming the center-of-gravity stabilizing frame 42 to have a L-shaped cross section extending toward an outer periphery.

[Method for Setting Up Heat Insulating Load Jig]

A method for setting up the heat insulating load jig of the embodiment is described with reference to FIG. 10.

Figure 10:
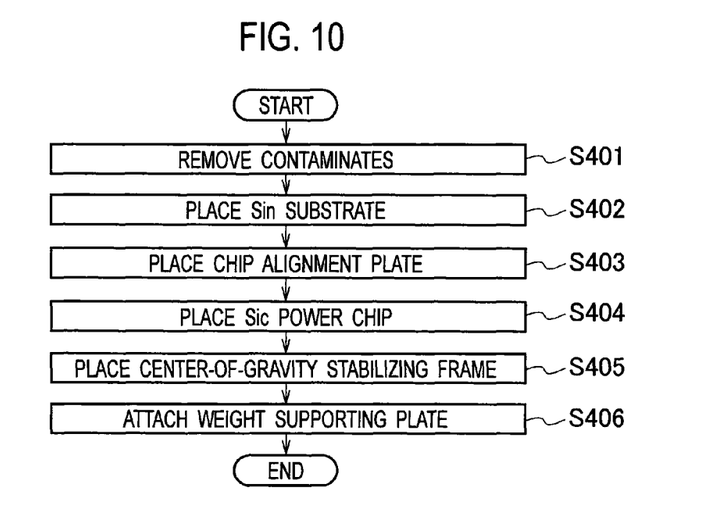
FIG. 10 is a flowchart showing procedures of a method for setting up the heat insulating load jig in the third embodiment of the present invention.

As shown in FIG. 10, contaminants are first removed (S401), the SiN substrate 12 is placed on the susceptor 5 (S402), and the chip alignment plate 18 is then placed on the SiN substrate 12 while being aligned therewith (S403), as in the first embodiment. Thereafter, the AuGe eutectic solder sheet 14 and the SiC power chip 13 are sequentially dropped into the chip through hole provided in the chip alignment plate 18 (S404).

Then, in step S405, the center-of-gravity stabilizing frame 42 is placed on a peripheral portion of the chip alignment plate 18 and the SiN substrate 12.

Next, in step S406, the weight supporting plate 39 is gently dropped into the center-of-gravity stabilizing frame 42, the weight supporting plate 39 being assembled such that the connection columns 20a, 20b, . . . are fixed thereto and the metal weight 36 (heat insulator load) to which the heat insulating body 37 is attached is inserted into the through hole of the weight supporting plate 39. The set-up of the heat insulating load jig is thus completed as shown in FIG. 9. As a matter of course, it is possible to attach the weight supporting plate 39 first and then attach the metal weight 36 to which the heat insulating body 37 is attached.

Thereafter, by performing the reflow process as described in the first embodiment, the method for manufacturing the SiC semiconductor device of the present invention is finished and the SiC semiconductor device based on the present invention is completed.

As described above, since the third embodiment includes all of the configurations of the first and second embodiments, the third embodiment can exert all of the effects obtained in the first and second embodiments. Furthermore, since the heat insulating load jig 41 is configured to include the center-of-gravity stabilizing frame 42, a risk of the heat insulating load jig 41 tipping over can be reduced. Hence, it is possible to increase the speed of the conveyor or the speed of the arm of the robot in the mass production apparatus employing the mode in which the susceptor 5 moves like a conveyor or the mass production apparatus configured to place the heat insulating load jig with the robot, and improve productivity.

Fourth Embodiment

In the first to third embodiments, description is given of simplified cases where one SiC power chip is bonded. However, the embodiments described above are not limited to bonding of one power chip and can be applied to a case of bonding multiple chips as a matter of course. To prove this, in the fourth embodiment, description is given of a case where the third embodiment is applied to bonding of multiple chips. Moreover, in the fourth embodiment, the heat insulating load jig is modified to improve productivity. Since the fourth embodiment is the same as the aforementioned embodiments except for the configuration of the heat insulating load jig and the method for setting up the heat insulating load jig, overlapping description is omitted.

Figure 11:
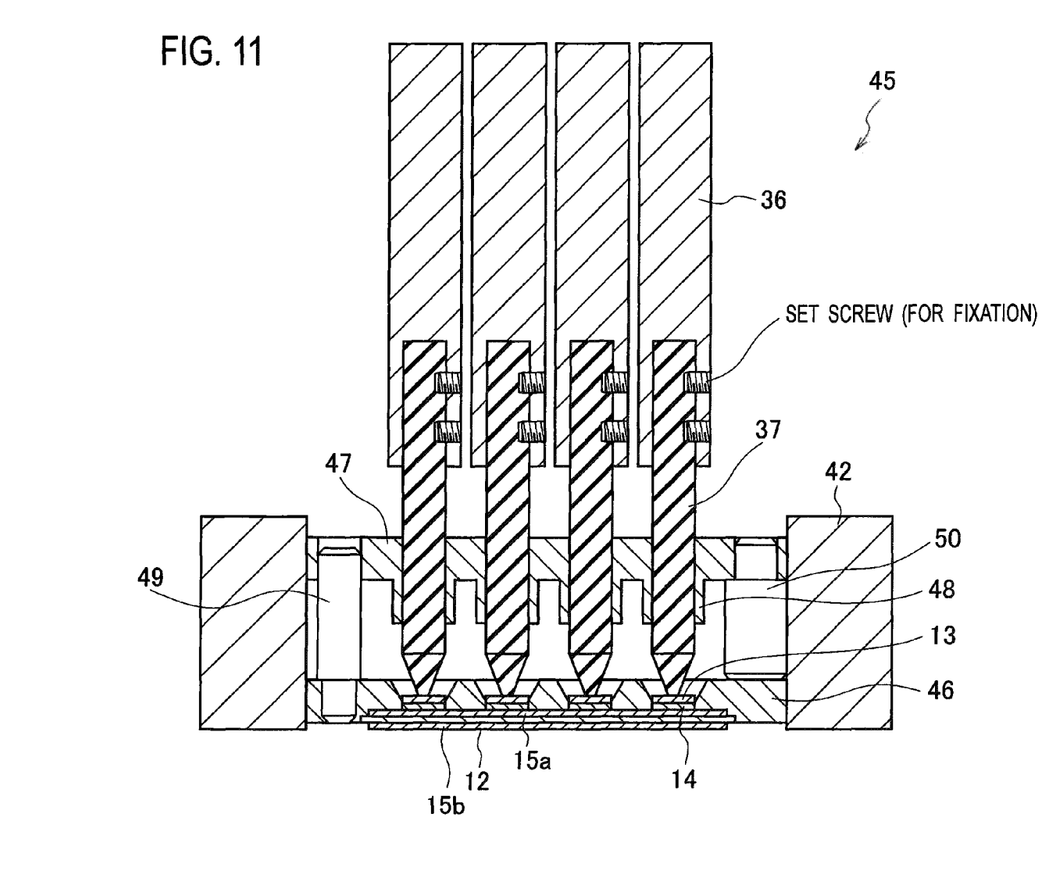
FIG. 11 is a cross-sectional diagram showing a structure of a heat insulating load jig in a fourth embodiment of the present invention.

FIG. 11 is a cross-sectional diagram of a main portion of a heat insulating load jig 45 of the fourth embodiment and is an assembly diagram showing a state where the heat insulating load jig 45 is attached above the SiN substrate 12 and the SiC power chip 13. Constitutional parts denoted by the same reference numerals as those in the first to third embodiments are the same parts as those in these embodiments, and description thereof is omitted to avoid overlapping description.

In FIG. 11, reference numeral 46 denotes a chip alignment plate. The chip alignment plate 46 is significantly different from the chip alignment plate 18 in the first to third embodiment in that an upper portion of each of chip through holes for placing power chips has a tapered shape (slope) inclined to become wider toward the upper side. Due to this tapered shape, the AuGe solder and the SiC power chip slide down the taper and are automatically arranged at an exact position. In other words, this tapered shape has such an effect that positional accuracy required for placement of the AuGe solder and the SiC power chip is greatly relaxed and productivity in chip placement can be improved.

Moreover, reference numeral 47 denotes a weight supporting plate. The weight supporting plate 47 has the same basic functions as the weight supporting plate 39 in the first to third embodiments but is different in that the weight supporting plate 47 includes opening portion sheaths 48 respectively for weight through holes through which the heat insulating bodies 37 (or the metal weights 36) pass. The opening portion sheaths 48 have functions of preventing the heat insulating bodies 37 and the metal weights 36 from tipping over and maintaining the postures of the heat insulating bodies 37 and the metal weights 36 in a substantially vertical state. In a case where there are many metal weights 36 as shown in FIG. 11, a large moment is generated when the metal weights 36 tip over in the same direction even if the tipping of each of the metal weights 36 is a small degree, and the heat insulating load jig 45 may tip over. Providing the opening portion sheaths 48 for the weight through holes can thus greatly reduce the risk of the heat insulating load jig 45 tipping over.

Furthermore, reference numeral 49 denotes first connection columns, and 50 denotes second connection columns. The first connection columns 49 are configured to be fixed to the weight supporting plate 47 and come into contact with a surface of the chip alignment plate 46. Since a purpose of the first connection columns 49 is to support the weight supporting plate 47, at least three, desirably four or more first connection columns 49 are preferably provided.

Meanwhile, the second connection columns 50 are fixed to the chip alignment plate 46 and can be easily inserted into opening portions penetrating predetermined portions of the weight supporting plate 47 with a certain clearance provided. The function of the second connection columns 50 is to quickly and accurately align the weight supporting plate 47 with the chip alignment plate 46. Since a work time required for the alignment becomes longer as the number of the second connection columns 50 becomes greater (this is because the number of portions to be inserted and fitted becomes greater), the number of the second connection columns 50 provided is desirably the smallest possible number equal to or greater than two.

Note that, in the embodiment, the connection columns are divided into two types of the first connection column and the second connection column. However, the configuration may such that connection columns are not divided into various types as described in the first to third embodiments.

[Method for Setting Up Heat Insulating Load Jig]

Next, a method for setting up the heat insulating load jig of the fourth embodiment is described. Note that a flowchart of the embodiment is the same as the flowchart of the third embodiment shown in FIG. 10 and is thus omitted.

Contaminants are first removed, the SiN substrate 12 is placed on the susceptor 5 (omitted in the drawing), and the chip alignment plate 46 to which the second columns 50 are attached is then placed on the SiN substrate 12 while being aligned therewith. Thereafter, the AuGe eutectic solder sheet 14 and the SiC power chip 13 are placed by being sequentially dropped into each of the chip through holes provided in the chip alignment plate 46, the AuGe eutectic solder sheets 14 and the SiC power chips 13 being provided as many as the opening portions of the chip alignment plate 46.

Then, the center-of-gravity stabilizing frame 42 is placed around the outer peripheries of the chip alignment plate 46 and the SiN substrate 12.

Next, the first connection columns 49 are attached, and the weight supporting plate 47 assembly having through holes into which the multiple heat insulating bodies 37 (with the metal weights 36) are inserted is gently dropped into the center-of-gravity stabilizing frame 42. The set-up of the heat insulating load jig is thus completed.

Thereafter, by performing the reflow process as described in the first embodiment, the method for manufacturing the SiC semiconductor device of the present invention is finished and the SiC semiconductor device of the present invention is completed.

As described above in detail, the heat insulating load jig of the embodiment can bond multiple SiC power chips and improve productivity.

Moreover, in the heat insulating load jig of the embodiment, since each of the chip through holes of the chip alignment plate 46 has the tapered structure inclined to become wider toward the upper side, it is possible to greatly relax the positional accuracy required for the placement of the AuGe solder and the SiC power chip and improve productivity in chip placement.

Furthermore, in the heat insulating load jig of the embodiment, the sheath structures having the same cross section as the weight through holes of the weight supporting plate 47 are attached to the weight through holes. Accordingly, the risk of the heat insulating load jig 45 tipping over can be greatly reduced.

Fifth Embodiment

The aforementioned heat insulating load jigs of the first to fourth embodiments are configured such that the weight supporting plate is placed on the chip alignment plate via the connection columns. However, the heat insulating load jig can be configured without using the connection columns. In the fifth embodiment, a heat insulating load jig having such a configuration is provided.

Figure 12:
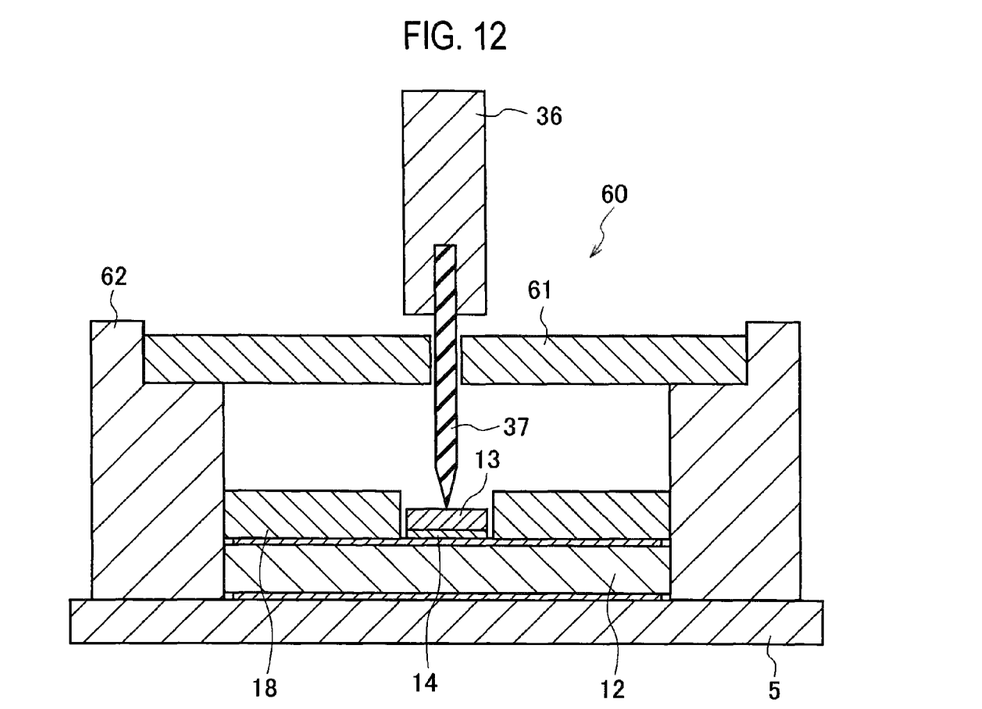
FIG. 12 is a cross-sectional diagram showing a structure of a heat insulating load jig in a fifth embodiment of the present invention.

FIG. 12 is a cross-sectional diagram of a main portion of a heat insulating load jig 60 of the fifth embodiment. Constitutional parts denoted by the same reference numerals as those in the aforementioned embodiments are the same members, and description thereof is omitted to avoid overlapping description.

In FIG. 12, reference numeral 61 denotes a weight supporting plate, and 62 denotes a center-of-gravity stabilizing frame.

The functions and material of the weight supporting plate 61 are completely the same as the weight supporting plate 39 in the aforementioned embodiments. However, the weight supporting plate 61 is supported not by the connection columns but by the center-of-gravity stabilizing frame 62. Moreover, the positioning of the weight supporting plate 61 relative to the SiN substrate 12 is also performed by using the center-of-gravity stabilizing frame 62.

[Method for Setting Up Heat Insulating Load Jig]

Next, a method for setting up the heat insulating load jig of the fifth embodiment is described with reference to FIG. 13.

Figure 13:
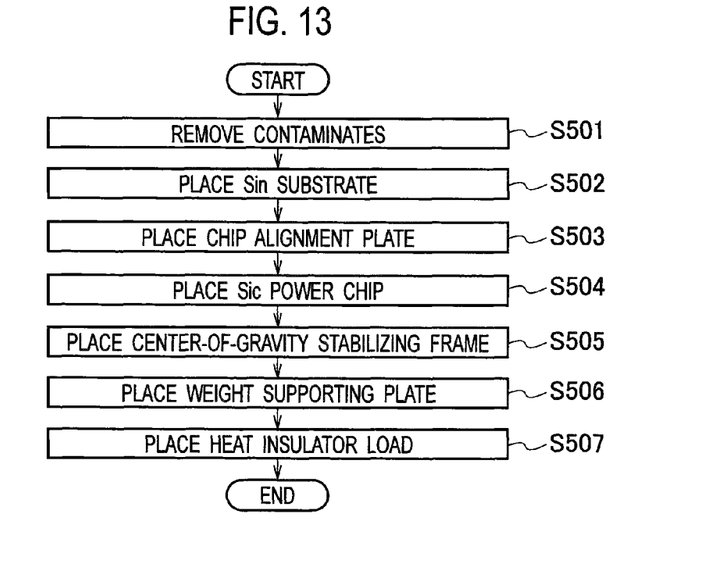
FIG. 13 is a flowchart showing procedures of a method for setting up the heat insulating load jig in the fifth embodiment of the present invention.

As shown in FIG. 13, contaminants are first removed (S501), the SiN substrate 12 is placed on the susceptor 5 (S502), and the chip alignment plate 18 is then placed on the SiN substrate 12 while being aligned therewith (S503). Thereafter, the AuGe eutectic solder sheet 14 and the SiC power chip 13 are placed by being sequentially dropped into the chip through hole provided in the chip alignment plate 18 (S504). The steps described so far are completely the same as those in the first to fourth embodiments.

Subsequently, in step S505, the center-of-gravity stabilizing frame 62 is placed on peripheries of the chip alignment plate 18 and the SiN substrate 12. Next, in step S506, the weight supporting plate 61 is placed by being gently dropped into a recess portion of the center-of-gravity stabilizing frame 62. Then, in step S507, the metal weight 36 to which the heat insulating body 37 is fixed is inserted into the weight supporting plate 61. The set-up of the heat insulating load jig 60 is thus completed as shown in FIG. 12.

Thereafter, by performing the reflow process as described in the first embodiment, the method for manufacturing the SiC semiconductor device of the present invention is finished and the SiC semiconductor device of the present invention is completed.

As is apparent from the above description, since the heat insulating load jig of the fifth embodiment includes all of the functions of the third embodiment, the heat insulating load jig can exert all of the effects obtained in the third embodiment. Moreover, in the embodiment, since the heat insulating load jig is configured to include no connection columns, there is obtained such a unique effect that the heat insulating load jig can be fabricated at a lower cost than in the first to fourth embodiments. Moreover, preparing an assembly in which the weight supporting plate 61 and the metal weight 36 (integrated with the heat insulating body 37) are assembled to the center-of-gravity stabilizing frame 62 in advance enables the center-of-gravity stabilizing frame 62, the weight supporting plate 61, and the metal weight 36 (integrated with the heat insulating body 37) to be attached and removed in one step. Hence, there is obtained such an effect that the productivity can be further improved.

Although the present invention has been described above based on the embodiments illustrated in the drawings, the present invention is not limited to these embodiments. The configuration of each of the parts can be replaced by any configuration having the similar function.

This application claims the priority of Japanese Patent Application No. 2012-102954 filed on Apr. 27, 2012, contents of which is incorporated herein by reference.

INDUSTRIAL APPLICABILITY

In the method for manufacturing the semiconductor device, the heat insulating load jig, and the method for setting up the heat insulating load jig of one embodiment of the present invention, load is applied to the semiconductor device from above via the heat insulating body. Accordingly, the semiconductor device and the load are thermally insulated from each other, and it is possible to achieve rapid heating, melting of the solder in a short time, and rapid cooling. This can not only reduce voids but also avoid excessive temperature rise and long-time heat treatment and practically eliminate thermal damage to the semiconductor device. As a result, a highly-reliable power semiconductor device bonded by using high-temperature solder with few voids can be obtained in a high yield. Accordingly, the method for manufacturing the semiconductor device, the heat insulating load jig, and the method for setting up the heat insulating load jig of one embodiment of the present invention are useful in industries.

REFERENCE SIGNS LIST 1 reflow equipment
2a, 2b chamber
3 exhaust device
4 gas supplying device
5 susceptor
6 lamp heater
7 program control device
10 bonding sample
11, 31, 41, 45, 60 heat insulating load jig
12 SiN substrate
13 SiC power chip
14 AuGe solder
15a, 15b Cu circuit plate
16, 36 metal weight
17, 37 heat insulating body
18, 46 chip alignment plate
19, 39, 47, 61 weight supporting plate
20a, 21b, 49, 50 connection column
42, 62 center-of-gravity stabilizing frame
70 heat insulator load

The invention claimed is:
1. A heat insulating load jig configured to apply load in bonding of a circuit board and a semiconductor chip, comprising:
 a chip alignment plate having a function of alignment with the circuit board and having a chip through hole used to arrange a solder sheet and the semiconductor chip at a predetermined position of the circuit board;

a weight supporting plate arranged above and away from the chip alignment plate by a predetermined distance, the weight supporting plate having a function of alignment with the chip alignment plate or the circuit board and having a weight through hole at a position corresponding to the position of the chip through hole; and a heat insulating load configured to be placed on an upper side of the semiconductor chip through the weight through hole and formed by integrating a heat insulating body configured to be disposed in contact with the semiconductor chip and a metal load configured to be disposed on an upper side of the heat insulating body, wherein the chip alignment plate has a same external dimension as the circuit board in a lateral direction and is arranged on an upper surface of the circuit board.

2. The heat insulating load jig according to claim 1, further comprising a connection column configured to detachably connect the chip alignment plate and the weight supporting plate to each other.

3. The heat insulating load jig according to claim 2, wherein the connection column is fixed to the chip alignment plate or the weight supporting plate.

4. The heat insulating load jig according to claim 2, further comprising a center-of-gravity stabilizing frame configured to be disposed on peripheries of the weight supporting plate, the circuit board, and the chip alignment plate and having an inner wall coming into contact with at least one of the weight supporting plate, the circuit board, and the chip alignment plate.

5. The heat insulating load jig according to claim 1, further comprising a center-of-gravity stabilizing frame configured to support the weight supporting plate at a predetermined position above the chip alignment plate, the center-of-gravity stabilizing frame disposed on peripheries of the circuit board and the chip alignment plate and having an inner wall configured to come into contact with at least one of the circuit board and the chip alignment plate.

6. The heat insulating load jig according to claim 1, wherein the chip through hole of the chip alignment plate has a tapered structure inclined to become wider toward an upper side.

7. The heat insulating load jig according to claim 1, wherein a sheath structure having a cross section same as that of the weight through hole of the weight supporting plate is attached to the weight through hole.

8. A heat insulating load jig configured to apply load in bonding of a circuit board and a semiconductor chip, comprising:

chip alignment means having a function of alignment with the circuit board and having a chip through hole used to arrange a solder sheet and the semiconductor chip at a predetermined position of the circuit board;

weight supporting means arranged above and away from the chip alignment means by a predetermined distance, the weight supporting means having a function of alignment with the chip alignment means or the circuit board and having a weight through hole at a position corresponding to the position of the chip through hole; and heat insulating load means configured to be placed on an upper side of the semiconductor chip through the weight through hole and formed by integrating a heat insulating means configured to be disposed in contact with the semiconductor chip and a metal load means configured to be disposed on an upper side of the heat insulating means, wherein the chip alignment means has a same external dimension as the circuit board in a lateral direction and is arranged on an upper surface of the circuit board.

9. A heat insulating load jig configured to apply load in bonding of a circuit board and a semiconductor chip, comprising:

a chip alignment plate having a function of alignment with the circuit board and having a chip through hole used to arrange a solder sheet and the semiconductor chip at a predetermined position of the circuit board;

a weight supporting plate arranged above and away from the chip alignment plate by a predetermined distance, the weight supporting plate having a function of alignment with the chip alignment plate or the circuit board and having a weight through hole at a position corresponding to the position of the chip through hole;

a heat insulating load configured to be placed on an upper side of the semiconductor chip through the weight through hole and formed by integrating a heat insulating body configured to be disposed in contact with the semiconductor chip and a metal load configured to be disposed on an upper side of the heat insulating body, wherein the chip alignment plate has a same external dimension as the circuit board in a lateral direction and is arranged on the circuit board; and a connection column configured to detachably connect the chip alignment plate and the weight supporting plate to each other.

10. A heat insulating load jig configured to apply load in bonding of a circuit board and a semiconductor chip, comprising:

a chip alignment plate having a function of alignment with the circuit board and having a chip through hole used to arrange a solder sheet and the semiconductor chip at a predetermined position of the circuit board;

a weight supporting plate arranged above and away from the chip alignment plate by a predetermined distance, the weight supporting plate having a function of alignment with the chip alignment plate or the circuit board and having a weight through hole at a position corresponding to the position of the chip through hole;

a heat insulating load configured to be placed on an upper side of the semiconductor chip through the weight through hole and formed by integrating a heat insulating body configured to be disposed in contact with the semiconductor chip and a metal load configured to be disposed on an upper side of the heat insulating body, wherein the chip alignment plate has a same external dimension as the circuit board in a lateral direction and is arranged on the circuit board; and a center-of-gravity stabilizing frame configured to support the weight supporting plate at a predetermined position above the chip alignment plate, the center-of-gravity stabilizing frame disposed on peripheries of the circuit board and the chip alignment plate and having an inner wall configured to come into contact with at least one of the circuit board and the chip alignment plate.

* * * * *